United States Patent
Dhindsa et al.

(10) Patent No.: US 8,262,847 B2
(45) Date of Patent: Sep. 11, 2012

(54) PLASMA-ENHANCED SUBSTRATE PROCESSING METHOD AND APPARATUS

(75) Inventors: Rajinder Dhindsa, San Jose, CA (US);
Hudson Eric, Berkeley, CA (US);
Alexei Marakhtanov, Albany, CA (US);
Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 214 days.

(21) Appl. No.: 11/618,583

(22) Filed: Dec. 29, 2006

(65) Prior Publication Data

US 2008/0160776 A1 Jul. 3, 2008

(51) Int. Cl.
*C23F 1/00* (2006.01)
*H01L 21/306* (2006.01)
*C23C 16/00* (2006.01)

(52) U.S. Cl. ........... 156/345.44; 156/345.28; 118/723 E
(58) Field of Classification Search .................. 118/715, 118/723 R; 156/345.1, 345.43, 345.47
See application file for complete search history.

(56) References Cited

U.S. PATENT DOCUMENTS

| | | | | |
|---|---|---|---|---|
| 5,057,185 A | * | 10/1991 | Thomas et al. | 438/710 |
| 5,116,482 A | * | 5/1992 | Setoyama et al. | 204/298.08 |
| 5,981,899 A | * | 11/1999 | Perrin et al. | 219/121.52 |
| 6,265,831 B1 | * | 7/2001 | Howald et al. | 315/111.21 |
| 6,642,661 B2 | * | 11/2003 | Strang | 315/111.21 |
| 6,667,577 B2 | * | 12/2003 | Shannon et al. | 315/111.21 |
| 6,744,212 B2 | | 6/2004 | Fischer et al. | |
| 6,849,154 B2 | * | 2/2005 | Nagahata et al. | 156/345.47 |
| 6,917,204 B2 | * | 7/2005 | Mitrovic et al. | 324/464 |
| 7,440,301 B2 | | 10/2008 | Kirchmeier et al. | |
| 2001/0013504 A1 | * | 8/2001 | Imafuku et al. | 216/71 |
| 2005/0155711 A1 | | 7/2005 | Sumiya et al. | |
| 2005/0211384 A1 | * | 9/2005 | Hayashi | 156/345.47 |
| 2006/0021701 A1 | | 2/2006 | Tobe et al. | |
| 2006/0113037 A1 | | 6/2006 | Nishio | |
| 2006/0196426 A1 | | 9/2006 | Gluck et al. | |

(Continued)

FOREIGN PATENT DOCUMENTS

JP 12323460 A 11/2000

(Continued)

OTHER PUBLICATIONS

"Written Opinion", Issue in PCT Application No. PCT/US2007/87670; Mailing Date.: Apr. 29, 2008.

(Continued)

*Primary Examiner* — Maureen Gramaglia
(74) *Attorney, Agent, or Firm* — IPSG, P.C., Intellectual Property Law (57) ABSTRACT

A method and apparatus for processing a substrate in a capacitively-coupled plasma processing system having a plasma processing chamber and at least an upper electrode and a lower electrode. The substrate is disposed on the lower electrode during plasma processing. The method includes providing at least a first RF signal, which has a first RF frequency, to the lower electrode. The first RF signal couples with a plasma in the plasma processing chamber, thereby inducing an induced RF signal on the upper electrode. The method also includes providing a second RF signal to the upper electrode. The second RF signal also has the first RF frequency. A phase of the second RF signal is offset from a phase of the first RF signal by a value that is less than 10%. The method further includes processing the substrate while the second RF signal is provided to the upper electrode.

13 Claims, 4 Drawing Sheets

U.S. PATENT DOCUMENTS

| | | |
|---|---|---|
| 2007/0020941 A1 | 1/2007 | Tamura et al. |
| 2007/0044715 A1 | 3/2007 | Blattner et al. |
| 2007/0193975 A1 | 8/2007 | Wilson |
| 2008/0160775 A1 | 7/2008 | Dhindsa et al. |

FOREIGN PATENT DOCUMENTS

| | | |
|---|---|---|
| JP | 13244098 A | 9/2001 |
| JP | 18270018 A | 10/2006 |
| WO | WO 2006/063035 A2 | 6/2006 |

OTHER PUBLICATIONS

"International Search Report", Issue in PCT Application No. PCT/US2007/87670; Mailing Date.: Apr. 29, 2008.

"International Search Report", Issued in PCT Application No. PCT/US2007/087671; Mailing Date: May 2, 2008.

"Written Opinion", Issued in PCT Application No. PCT/US2007/087671; Mailing Date: May 2, 2008.

"Non Finai Office Action", U.S. Appl. No. 11/618,563, Mailing Date: Dec. 14, 2009.

"Final Office Action", U.S. Appl. No. 11/618,563, Mailing Date: Mar. 17, 2010.

"International Preliminary Report on Patentability", Issued in PCT Application No. PCT/US2007/087671; Mailing Date: Jul. 9, 2009.

"Non Final Office Action", U.S. Appl. No. 11/618,563, Mailing Date: Dec. 9, 2010.

"Written Opinion", Issued in Singapore Application No. SG 200904367-0; Mailing Date: May 20, 2010.

"Final Office Action", U.S. Appl. No. 11/618,563, Mailing Date: Feb. 1, 2011.

"First Office Action", issued in Chinese Application No. 200780051931.2; Mailing Date: Dec. 6, 2010.

"Substantive Examination Report", Issued in Singapore Application No. 200904367-0; Mailing: Date: Feb. 22, 2011.

* cited by examiner

PLASMA-ENHANCED SUBSTRATE PROCESSING METHOD AND APPARATUS

CROSS REFERENCE TO RELATED APPLICATIONS

The present invention is related to the following applications, all of which are incorporated herein by reference:

Commonly assigned application entitled "Method and Apparatus for Processing a Substrate Using Plasma", filed on even date herewith by the same inventors herein

BACKGROUND OF THE INVENTION

In the processing of semiconductor substrates, plasma processing is often employed. Plasma processing may involve different plasma-generating technologies, for example, inductively-coupled plasma processing systems, capacitively-coupled plasma processing systems, microwave-generated plasma processing systems, and the like. Manufacturers often employ capacitively-coupled plasma processing systems in processes that involve the etching of materials using a photo resist mask.

Important consideration for plasma processing of substrates involves a high etch rate and a high photo resist selectivity. A high etch rate refers to the rate at which the target material is etched during plasma processing. Generally speaking, the faster the underlying layer can be etched, a greater number of wafers can be processed per unit of time. All things being equal, manufacturers desire to process more wafers per unit of time to increase wafer processing efficiency. Photo resist selectivity refers to the discrimination between the photo resist mask and the underlying target layer during etching.

As circuit density increases, manufacturers are required to etch or to form a greater number of devices per unit area on the wafer. The higher device density requires a thinner photo resist layer. The thinner photo resist layer, in turn, tends to be more susceptible to being inadvertently etched away. As a result, manufacturers constantly strive to create processing recipes that can etch the underlying layer at a high etch rate while avoiding damage to the photo resist mask.

Figure 1:
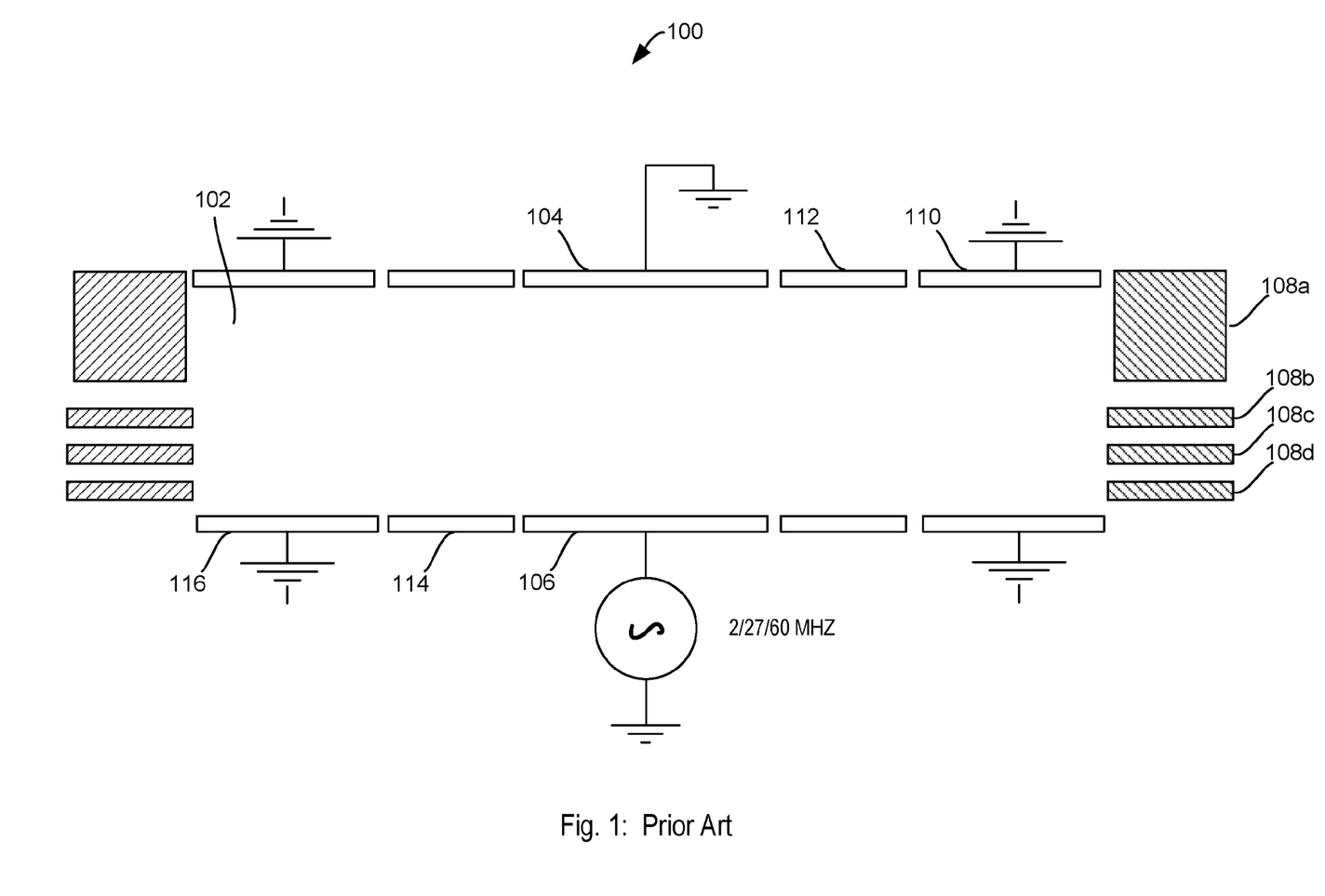
FIG. 1 shows a prior art multi-frequency capacitively-coupled plasma processing system, representing the plasma processing system typically employed to process substrates.

One way to increase the etch rate is to increase the plasma density during plasma processing. In a capacitively-coupled plasma processing system, plasma density may be increased by increasing the power of the higher frequency RF signals. To facilitate discussion, FIG. 1 shows a prior art multi-frequency capacitively-coupled plasma processing system 100, representing the plasma processing system typically employed to process substrates. As seen in FIG. 1, multi-frequency capacitively-coupled plasma processing system 100 includes a chamber 102 which is disposed in between an upper electrode 104 and a lower electrode 106.

In the implementation of FIG. 1, lower electrode 106 is provided with multiple RF frequencies, such as 2 Megahertz, 27 Megahertz, and 60 Megahertz. Upper electrode 104 is grounded in the implementation of FIG. 1. Multi-frequency capacitively-coupled plasma processing system 100 also includes a plurality of confinement rings 108A, 108B, 108C, and 108D. The confinement rings 108A-108D function to confine the plasma within chamber 102 during plasma processing.

There is also shown in FIG. 1 a peripheral RF grounded ring 10, representing the RF ground for the plasma generated within chamber 102. To isolate peripheral RF ground 110 from upper electrode 104, an insulating ring 112 is typically provided. A similar insulating ring 114 is also provided to insulate lower electrode 106 from an RF ground 116. During plasma processing, the RF power provided to lower electrode 106 excites etching gas provided into chamber 102, thereby generating a plasma within chamber 102 to etch a substrate that is typically disposed on lower electrode 106 (substrate is not shown to simplify FIG. 1).

As discussed earlier, it is highly desirable to etch the target layer on the substrate while the substrate is disposed in chamber 102 without unduly damaging the overlying photo resist mask. In the prior art, increasing the etch rate of the target layer may be achieved by increasing the plasma density within chamber 102. Generally speaking, the plasma density may be increased by increasing the power level of the higher frequency RF signals that are provided to lower electrode 106. In the context of the present invention, a high frequency RF signal is defined as signals having a frequency higher than about 10 Megahertz. Conversely, RF signals with frequencies below 10 Megahertz are referred to herein as Low Frequency Signals.

However, by increasing the power level of the higher frequency RF signals (e.g., the 27 Megahertz RF signal or the 60 Megahertz RF signal of FIG. 1), it may be challenging to confine the generated plasma within chamber 102. Even if the plasma can be satisfactorily confined, electron loss to the upper electrode during plasma processing places an upper limit on the plasma density within chamber 102. It has been found that as the plasma density increases; electrons are lost to the grounded upper electrodes or other grounded surfaces of the multi-frequency capacitively-coupled plasma processing system 100, thereby causing the plasma density within chamber 102 to reach a saturation point. Beyond this saturation point, increasing the RF power of the higher frequency RF signal does not increase the plasma density since the electron loss outpaces the generation of ions.

Furthermore, increasing the RF power to the higher frequency RF signals has been found to adversely affect the photo resist selectivity. At a high RF power level, the photo resist mask is damaged to a greater extent due to increased bombardment, which causes the photo resist mask to erode away at a faster rate, thereby negatively impacting the etching process.

Figure 2:
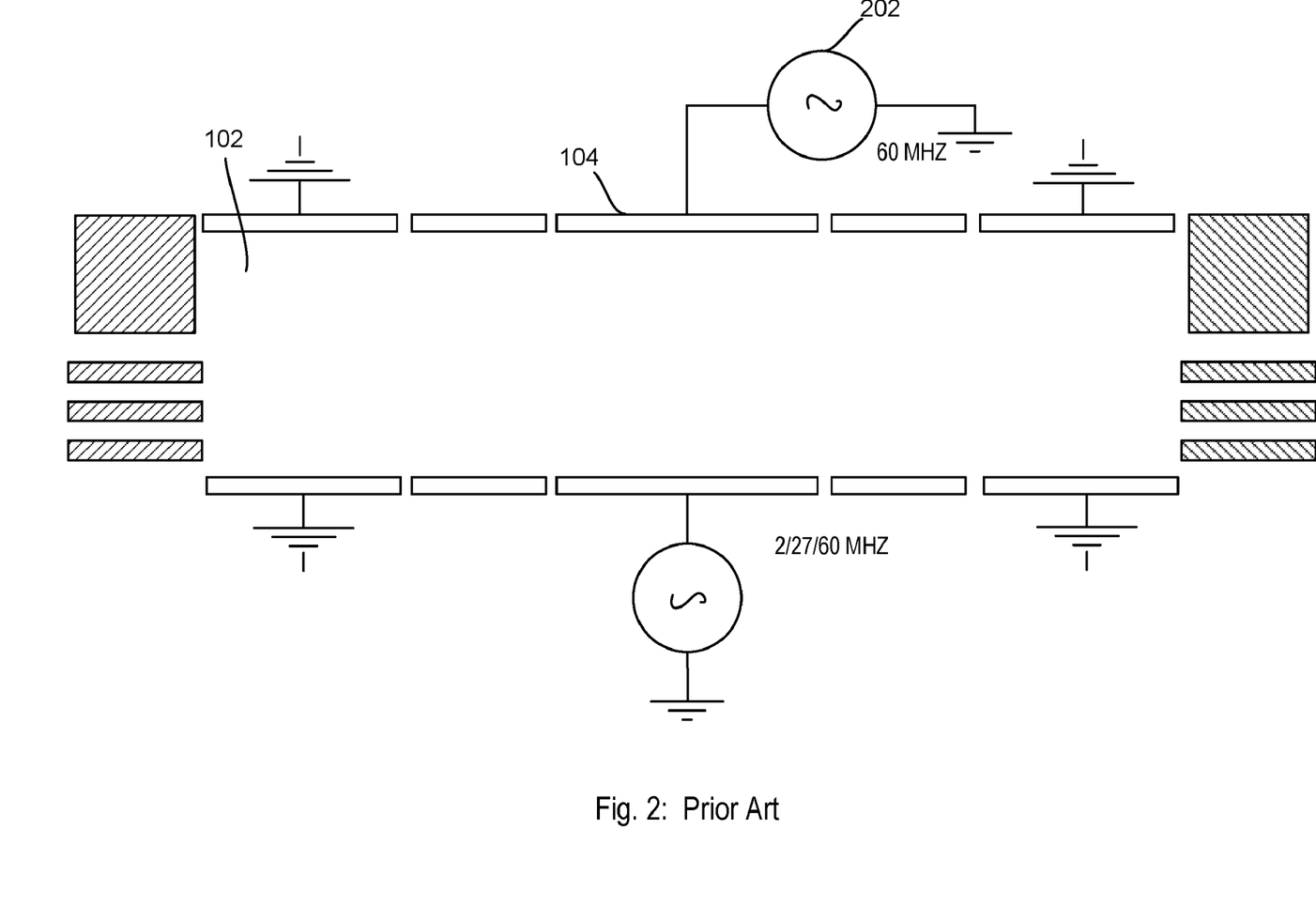
FIG. 2 shows a prior art implementation whereby one or more high frequency RF signals are provided to upper electrode in order to provide additional control over the generation of ions within chamber.

FIG. 2 shows a prior art implementation whereby one or more high frequency RF signals 202 (e.g., the 60 Megahertz RF signal of FIG. 2) are provided to upper electrode 104 in order to provide additional control over the generation of ions within chamber 102. However, the implementation of FIG. 2 still does not solve the aforementioned problem of plasma density saturation point effect. When the RF power level of the higher frequency signal provided to upper electrode 104 is increased, the aforementioned saturation point effect is also observed, limiting the plasma density and consequently, the etch rate through the target layer irrespective of the increase in the RF power level to the higher frequency RF signals.

Additionally, other prior art implementation has tried to control the photo resist selectivity by controlling the temperature of the electrodes. It has been found that the approach of controlling the temperature of the electrodes is minimally effective in controlling the photo resist selectivity. Furthermore, the approach of controlling the temperature of the electrodes does not address the aforementioned problem of plasma density saturation point effect.

Therefore, various aforementioned prior art implementations have proven ineffective in increasing etch rate without adversely affecting or maintaining high photo resist selectivity in capacitively-coupled plasma processing system in processes that involve the etching of materials using a photo resist mask. In the prior art implementation of FIG. 1, the increase in RF power to the lower electrode may lead to unconfinement of plasma, saturation point of plasma density, and adversely affect the photo resist selectivity. Whereas in the prior art implementation of FIG. 2, the increase in RF power to the upper electrode may lead to saturation point of plasma density. Furthermore, the prior art implementation of controlling temperature of the electrodes is minimally effective in controlling the photo resist selectivity while providing no solution for the plasma density saturation effect.

SUMMARY OF INVENTION

The invention relates, in an embodiment, to a method for processing a substrate in a capacitively-coupled plasma processing system, which has a plasma processing chamber and at least an upper electrode and a lower electrode. The substrate is disposed on the lower electrode during plasma processing. The method includes providing at least a first RF signal to the lower electrode. The first RF signal has a first RF frequency. The first RF signal couples with a plasma in the plasma processing chamber, thereby inducing an induced RF signal on the upper electrode. The method also includes providing a second RF signal to the upper electrode. The second RF signal also has the first RF frequency. A phase of the second RF signal is offset from a phase of the first RF signal by a value that is less than 10%. The method further includes processing the substrate while the second RF signal is provided to the upper electrode.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 4b shows an example plot of an RF signal directed to the upper electrode running in phase with the RF signal from the lower electrode of FIG. 4a

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the invention, there are provided methods and arrangements for controlling the electron loss to the upper electrode such that the plasma density can be increased without the need to unduly increase the power to the plasma. By increasing the plasma density without a concomitant increase to the RF power requirement, the target layer can be etched at a higher rate without unduly degrading the photo resist selectivity. In an embodiment, the upper electrode is configured such that the upper electrode is negatively biased, thereby allowing electrons present in the plasma chamber to be repelled from the upper electrode and trapped within the plasma volume for a longer period of time. As the negatively charged electrons are trapped for a longer period of time, the plasma density is increased.

Generally speaking, during plasma processing the bombardment mechanism causes electrons to be emitted from the substrate. As discussed earlier, electron loss to the upper electrode limits the increase in plasma density since the electron loss creates saturation point effect which limits the plasma density increase irrespective of the RF power provided to the plasma. By driving the upper electrode more negatively, the electrons are thus repelled from the upper electrode instead of being quickly lost to the upper electrode, resulting in a greater number of electrons in the plasma, thereby increasing the plasma density. The higher plasma density then can more effectively etch the target layer to achieve the desired high etch rate. Since it is unnecessary to increase the RF power to achieve the high level of plasma density, photo resist selectivity is not adversely affected to the same degree as might have been in the prior art.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

Figure 3:
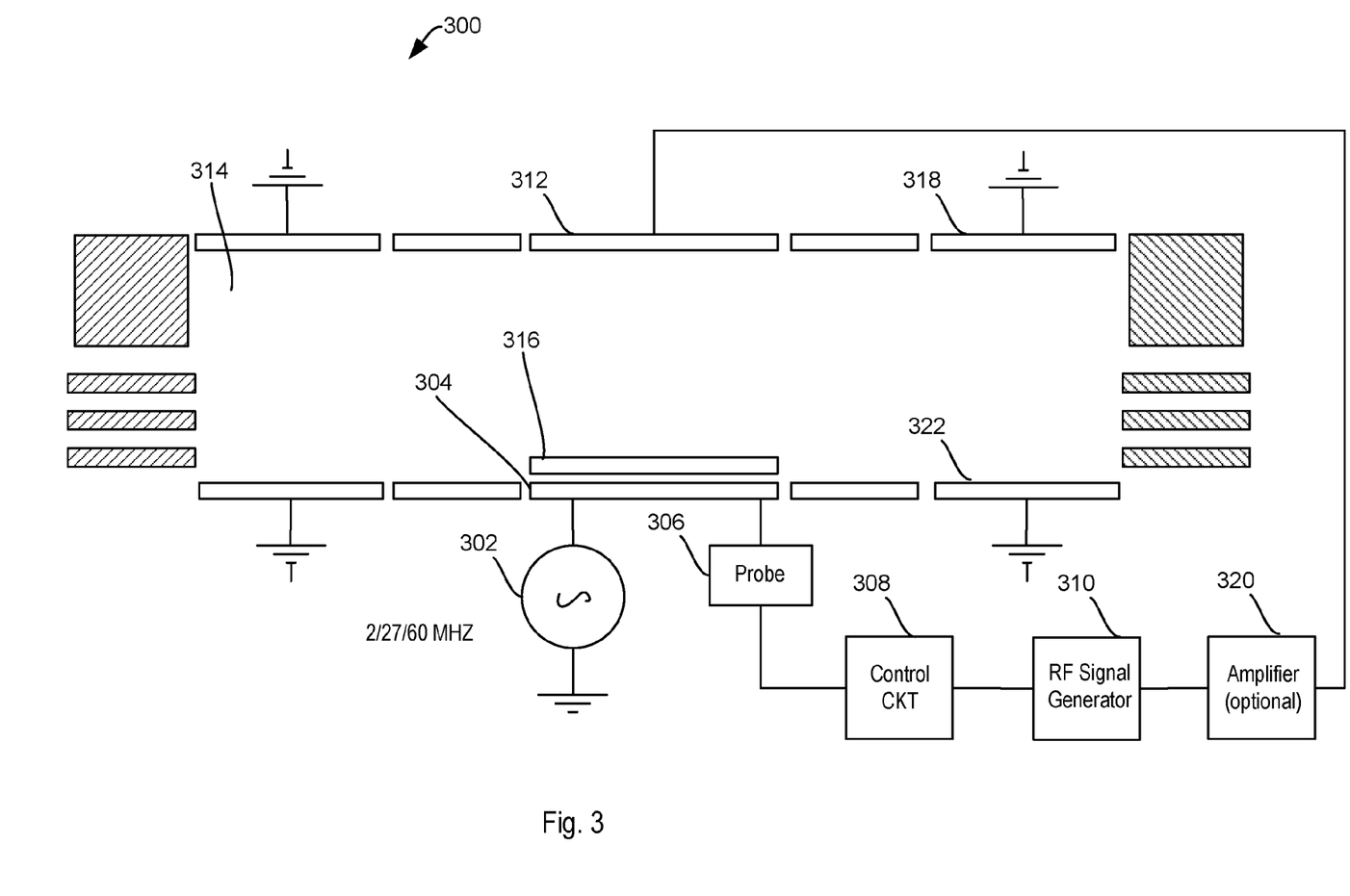
FIG. 3 shows a simplified diagram of an implementation wherein a mirroring circuit is employed to detect an RF signal from the lower electrode and to provide the upper electrode with a transformed RF signal that is in-phase with the RF signal of lower electrode during plasma processing.

FIG. 3 shows, in accordance with an embodiment of the present invention, a simplified diagram of an implementation wherein a mirroring circuit is employed to detect an RF signal from the lower electrode and to provide the upper electrode with a transformed RF signal that is in-phase with the RF signal of lower electrode during plasma processing. As the term is employed herein, in-phase denotes the implementation wherein the phase difference between the RF signal to the lower electrode and the RF signal to the upper electrode is within about 1%.

In the implementation of FIG. 3, lower electrode 304 is provided with multiple RF frequencies signal 302 such as 2 Megahertz, 27 Megahertz, and 60 Megahertz. In an embodiment, the RF signal from lower electrode 304 may be detected by probe 306, wherein probe 306 is a phase and amplitude detector designed to pick up low frequency RF signal, i.e., frequencies less than 10 Megahertz.

In accordance with an embodiment of the present invention, the signal from the probe 306 is directed to a control circuit 308. The control circuit 308 is provided with the capability for phase and amplitude adjustment allowing for the modification of the phase and/or amplitude of the RF signal depending on whether the RF signal is to be in-phase or out-of-phase with the RF signal from the lower electrode 304.

The control signal coming out of control circuit 308 is directed to an RF signal generator 310 for generating an RF signal. Thereafter, the RF signal generated by RF generator is optionally amplified (via amplifier 320) to the desired phase or amplitude. In the context of the embodiment of the present invention, the amplitudes of the RF signals from the upper and lower electrodes are considered to be the same when the values of the amplitudes are within about 1% of each other.

In the implementation of FIG. 3, the amplified RF signal from the amplifier 320 is directed to the upper electrode 312. Consequently, the RF signal being directed to the upper electrode is in-phase with the RF signal being supplied to the lower electrode in accordance with an embodiment of the present invention.

Figure 4A:
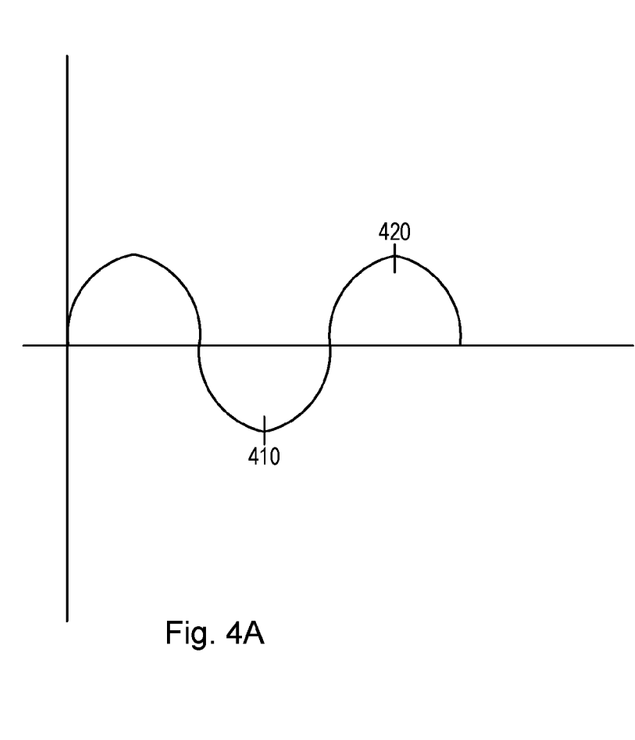
FIG. 4a shows an example plot of an RF signal from the lower electrode.
Figure 4B:
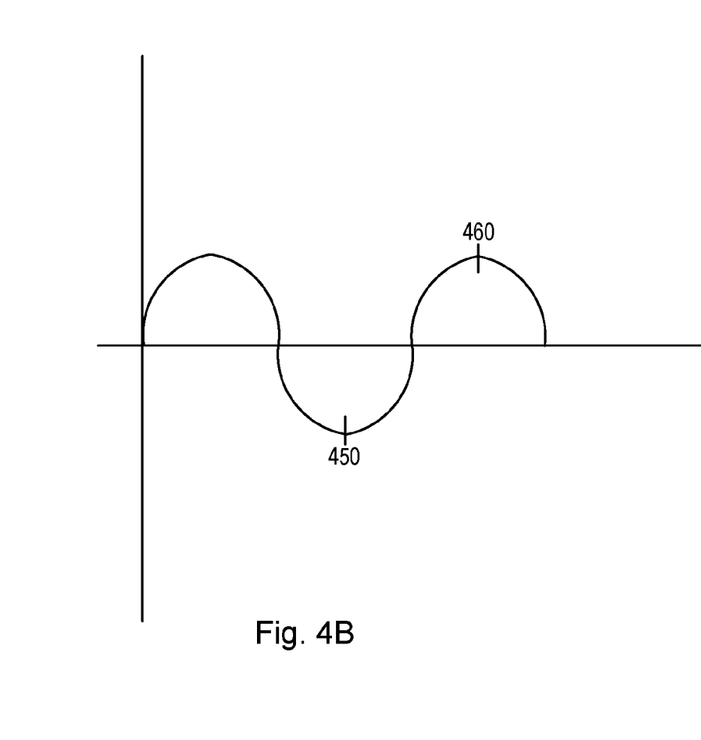

The features and advantages of having the RF signal directed to the upper electrode running in-phase with the RF signal from lower electrode in-phase can be better understood through FIGS. 4a and 4b. FIG. 4a shows an example plot of an RF signal from the lower electrode, in accordance with one embodiment of the present invention. FIG. 4b shows an example plot of an RF signal directed to the upper electrode running in phase with the RF signal from the lower electrode of FIG. 4a, in accordance with one embodiment of the present invention.

As mentioned previously, in-phase denotes the implementation wherein the phase difference between the RF signal to the lower electrode 304 and the RF signal to the upper electrode 312 is within about 1%. At the minimal points during the negative cycles of the implementation of FIGS. 4a and 4b, the RF signal 410 of the lower electrode and the RF signal 450 of the upper electrode are at the most negative voltage values with respect to the plasma.

Referring back to FIG. 3 when both RF signals are in-phase and at their minimal, as shown in FIGS. 4a and 4b, during plasma processing in the plasma chamber 314, the upper electrode 312 and lower electrode 304 are at their most negative values. The positive charged argon particles (not shown) in the plasma chamber 314 will accelerate and bombard the upper electrode 312 and the substrate 316, which is disposed above the lower electrode 304, to generate primary electrons which are low energy electrons and secondary embedded electrons which are high energy electrons.

Since both the substrate 316, disposed atop the lower electrode 304, and the upper electrode 312, during this negative cycle of RF signals, are at their most negative values, the maximum potential between the upper electrode 312 and lower electrode 304 with the plasma creates the highest electron trapping. The electrons that come off of the upper electrode 312 or the substrate 316 tend to be trapped between the negatively biased upper electrode 312 and the negatively biased substrate 316, which is disposed above the lower electrode 304. Since the electrons are negatively charged, the electrons might repel in between the two negatively charged upper electrode 312 and lower electrode 304. Instead of being immediately lost to upper electrode 312 (as may be the case if upper electrode 312 is grounded, for example) the negatively biased upper electrode 312 may repel the negatively charged electrons, thereby causing the electrons to be trapped in between upper electrode 312 and lower electrode 304 for a longer period of time. It is believed that eventually, through the mechanism of random collision, the negatively charged electrons are eventually lost to RF ground 318.

The longer residence time of the negatively charged electrons within plasma chamber 314 contributes to a higher plasma density without requiring a corresponding increase in the amount of RF power supplied to plasma processing chamber 300. Note that the mechanism to increase the plasma density of FIG. 3 does not require the increase in the RF power supplied to the RF signals. Consequently, the photo resist selectivity is not negatively impacted to the same degree that might have been impacted had the higher plasma density been achieved by increasing the RF power level.

At the maxima points during the positive cycles of the implementation of FIGS. 4a and 4b, the RF signal 420 of the lower electrode and the RF signal 460 of the upper electrode are at the highest positive voltage values with respect to the plasma. In accordance with an embodiment of the present invention, secondary electrons are not being emitted during this time because the potential between the upper electrode 312 and the lower electrode 304 with respect to the plasma is low.

Further, during the positive cycle, the plasma potential in the plasma volume is substantially higher than the potential of the peripheral ground plate. It is believed that secondary electrons ejected from these peripheral ground plates (e.g., ground plates 318 and 322) are also trapped in the plasma volume between the ground plates, resulting also in a longer residence time and a higher plasma density. Over the entire cycle (both negative and positive), the average plasma density is thus increased.

In an embodiment, the phase difference between the RF signal from the lower electrode and the RF signal from the upper electrode can be used as a knob to control the uniformity of etching, i.e., better photo resist selectivity to the underlying layer being etched. In the implementation of FIG. 3, an arrangement where the phase of the RF signal directed to the upper electrode 112 can be adjusted to the phase of the RF signal of the lower electrode 304 during part of the cycle where the RF signals are at their most negative values.

For example, it is known that lower energy electrons and higher energy electrons impact the etch process in different ways. Since a high density of higher energy electrons is believed to be beneficial for photo resist selectivity, it is desirable in many cases to negatively bias upper electrode 312 to cause more of the higher energy electrons to be trapped. It has been observed that unexpected beneficial etching uniformity may be achieved by adjusting the phase difference between the RF signal directed to the upper electrode 312 and the RF signal from the lower electrode 304 during the negative cycle. In accordance with an embodiment of the present invention, the phase shifting is found to be beneficial to etching uniformity for phase difference of less than about 10%.

As can be appreciated from the foregoing, embodiments of the invention achieve a higher level of plasma density to improve etching through the target layer in the capacitively-coupled plasma processing chamber without unduly damaging the photo resist during etching. By providing a mechanism for increasing the plasma density without requiring a concomitant increase in the RF power level of the RF signals provided to the plasma processing chamber, plasma density is increased while PR photo resist is maintained the same or is minimally impacted. Furthermore, the uniformity of etching is further enhanced through the control of the phase difference between the RF signal directed to the upper electrode and the RF signal to the lower electrode.

In an embodiment, the phase of the upper electrode RF signal may be adjusted to either lag or lead the phase of the lower electrode RF signal. When the upper electrode RF signal is out of phase with the lower electrode RF signal, it is observed that photoresist selectivity is reduced. For certain applications such as photoresist (PR) or polymer strip, controlling the relative phases between the upper electrode RF signal and lower electrode RF signal may improve the desired result of removing more PR or polymer.

Alternatively or additionally, the amplitude of the upper electrode RF signal may be adjusted to either exceed or to be lower than the amplitude of the lower electrode RF signal. When the amplitude of the upper electrode RF signal is not equal to the amplitude of the lower electrode RF signal (defined herein as being different by more than 5%), it is observed that photoresist selectivity is reduced. As in the case with the phase difference, for certain applications such as photoresist (PR) or polymer strip, controlling the relative amplitudes between the upper electrode RF signal and lower electrode RF signal may improve the desired result of removing more PR or polymer.

While this invention has been described in terms of several preferred embodiments, there are alterations, permutations, and equivalents, which fall within the scope of this invention. Also, the title, summary, and abstract are provided herein for convenience and should not be used to construe the scope of the claims herein. It should also be noted that there are many alternative ways of implementing the methods and apparatuses of the present invention. Although various examples are provided herein, it is intended that these examples be illustrative and not limiting with respect to the invention. It is therefore intended that the following appended claims be interpreted as including all such alterations, permutations, and equivalents as fall within the true spirit and scope of the present invention.

What is claimed is:

1. A capacitively-coupled plasma processing system having a plasma processing chamber for processing a substrate, the capacitively-coupled plasma processing system comprising:
    at least an upper electrode and a lower electrode for processing said substrate, said substrate being disposed on said lower electrode during plasma processing, said lower electrode is provided at least a first RF signal, said first RF signal having a first RF frequency, said first RF signal configured for exciting gas to generate plasma in said plasma processing chamber;
    a multiple-RF-frequency signal generator coupled with said lower electrode for providing said first RF signal; and
    a phase-mirroring arrangement coupled to at least said upper electrode and said lower electrode, said phase-mirroring arrangement including at least a detector for detecting a phase of said first RF signal and an amplitude of said first RF signal, said phase-mirroring arrangement further including at least a control circuit for generating a control signal based on said phase of said first RF signal and said amplitude of said first RF signal without using any data resulted from monitoring said upper electrode, said phase-mirroring arrangement further including at least an RF signal generator for generating a generated RF signal in response to said control signal, said RF signal generator being coupled to said detector through said control circuit, said control circuit controlling at least an amplitude of said generated RF signal, said phase-mirroring arrangement further including at least an amplifier configured to amplify said generated RF signal to produce a second RF signal and configured to provide said second RF signal to said upper electrode, said second RF signal having a second frequency, a value of said second frequency being equal to a value of said first RF frequency, a phase of said second RF signal being offset from a phase of said first RF signal by a value that is less than 10%, said substrate being processed while said second RF signal is provided to said upper electrode.

2. The capacitively-coupled plasma processing system of claim 1 wherein said phase of said second RF signal is in-phase with said phase of said first RF signal.

3. The capacitively-coupled plasma processing system of claim 1 wherein said second RF signal has an amplitude that is different from an amplitude of said first RF signal.

4. The capacitively-coupled plasma processing system of claim 1 wherein said second RF signal has an amplitude that is the same as an amplitude of said first RF signal.

5. The capacitively-coupled plasma processing system of claim 1 wherein said first RF frequency is a low RF frequency signal.

6. The capacitively-coupled plasma processing system of claim 5 wherein said low RF frequency signal of said first RF frequency is less than 10 MHz.

7. The capacitively-coupled plasma processing system of claim 1 wherein said capacitively-coupled plasma processing system represents a multi-frequency capacitively-coupled plasma processing system.

8. The capacitively-coupled plasma processing system of claim 1 wherein control circuit further controls a phase of said generated RF signal.

9. A capacitively-coupled plasma processing system having a plasma processing chamber for processing a substrate, the capacitively-coupled plasma processing system comprising:
    at least an upper electrode and a lower electrode for processing said substrate, said substrate being disposed on said lower electrode during plasma processing;
    a first RF generator for providing at least a first RF signal, to said lower electrode, said first RF signal having a first RF frequency, said first RF signal configured for exciting gas to generate plasma in said plasma processing chamber;
    a detector for detecting a phase of said first RF signal and an amplitude of said first RF signal;
    a control circuit for generating a control signal based on said phase of said first RF signal and said amplitude of said first RF signal without using any data resulted from monitoring said upper electrode;
    a second RF signal generator for generating a generated RF signal in response to said control signal, said second RF signal generator being coupled to said detector through said control circuit, said control circuit controlling at least an amplitude of said generated RF signal; and
    an amplifier configured to amplify said generated RF signal to produce a second RF signal, said amplifier further configured to provided said second RF signal to said upper electrode, said second RF signal having a second frequency, a value of said second frequency being equal to a value of said first RF frequency, a phase of said second RF signal being offset from a phase of said first RF signal by a value that is less than 10%, wherein said substrate is processed while said second RF signal is provided to said upper electrode.

10. The capacitively-coupled plasma processing system of claim 9 wherein said phase of said second RF signal is in-phase with said phase of said first RF signal.

11. The capacitively-coupled plasma processing system of claim 9 wherein said second RF signal has an amplitude that is different from an amplitude of said first RF signal.

12. The capacitively-coupled plasma processing system of claim 9 wherein said second RF signal has an amplitude that is the same as an amplitude of said first RF signal.

13. The capacitively-coupled plasma processing system of claim 9 wherein said phase of said second RF signal is offset using a phase-mirroring arrangement.

* * * * *